US006873509B2

(12) United States Patent
Partsch et al.

(10) Patent No.: US 6,873,509 B2
(45) Date of Patent: Mar. 29, 2005

(54) USE OF AN ON-DIE TEMPERATURE SENSING SCHEME FOR THERMAL PROTECTION OF DRAMS

(75) Inventors: Torsten Partsch, Chapel Hill, NC (US); Jennifer Huckaby, Raleigh, NC (US); Johnathan T. Edmonds, Cary, NC (US)

(73) Assignee: Infineon Technologies AG, Munich (DE)

( * ) Notice: Subject to any disclaimer, the term of this patent is extended or adjusted under 35 U.S.C. 154(b) by 314 days.

(21) Appl. No.: 10/144,572

(22) Filed: May 13, 2002

(65) Prior Publication Data

US 2003/0210505 A1 Nov. 13, 2003

(51) Int. Cl.[7] .................................................. H02H 5/04
(52) U.S. Cl. ...................................................... 361/103
(58) Field of Search .......................... 361/91, 103, 104, 361/105, 106, 111; 365/233

(56) References Cited

U.S. PATENT DOCUMENTS

| | | | | |
|---|---|---|---|---|
| 5,272,035 A | * | 12/1993 | Sekiya | ........................ 430/157 |
| 5,422,832 A | * | 6/1995 | Moyal | ........................ 702/132 |
| 5,550,702 A | * | 8/1996 | Schmidt et al. | .............. 361/103 |
| 5,805,403 A | * | 9/1998 | Chemla | ....................... 361/103 |
| 5,898,557 A | * | 4/1999 | Baba et al. | ................... 361/103 |
| 5,943,206 A | * | 8/1999 | Crayford | ..................... 361/103 |
| 6,051,933 A | * | 4/2000 | Aiello et al. | ............ 315/209 R |
| 6,259,652 B1 | | 7/2001 | Heyne et al. | |
| 6,272,035 B1 | | 8/2001 | Dietrich et al. | |
| 6,275,445 B1 | | 8/2001 | Dietrich et al. | |
| 6,285,176 B1 | | 9/2001 | Marx et al. | |
| 6,285,228 B1 | | 9/2001 | Heyne et al. | |
| 6,351,167 B1 | | 2/2002 | Hein et al. | |
| 6,351,360 B1 | * | 2/2002 | Kotowski et al. | ............ 361/103 |
| 6,366,527 B2 | | 4/2002 | Hein et al. | |
| 6,373,671 B1 | * | 4/2002 | Watanabe et al. | ........... 361/93.8 |
| 6,388,944 B2 | | 5/2002 | Schrögmeier et al. | |
| 6,404,610 B1 | * | 6/2002 | Chang | ......................... 361/103 |
| 6,480,024 B2 | | 11/2002 | Dietrich et al. | |
| 2001/0033523 A1 | | 10/2001 | Hein et al. | |
| 2001/0038566 A1 | | 11/2001 | Schrogmeier et al. | |
| 2002/0075707 A1 | | 6/2002 | Dietrich et al. | |
| 2002/0079925 A1 | | 6/2002 | Dietrich et al. | |
| 2002/0089319 A1 | | 7/2002 | Heyne et al. | |
| 2002/0093855 A1 | | 7/2002 | Heyne et al. | |
| 2002/0097541 A1 | * | 7/2002 | Wei et al. | ...................... 361/58 |
| 2002/0133750 A1 | | 9/2002 | Dietrich et al. | |
| 2002/0141279 A1 | | 10/2002 | Dietrich et al. | |
| 2003/0001636 A1 | | 1/2003 | Partsch et al. | |
| 2003/0012322 A1 | | 1/2003 | Partsch et al. | |

OTHER PUBLICATIONS

Pending Patent Application Assigned to Infineon Technologies North America Corp.: U.S. Appl. No. 10/144,597, filed May 13, 2002, Inventors: Alexander et al.
Pending Patent Application Assigned to Infineon Technologies North America Corp.: U.S. Appl. No. 10/256,539, filed Sep. 27, 2002, Inventors: Partsch et al.
Pending Patent Application Assigned to Infineon Technologies North America Corp.: U.S. Appl. No. 10/260,919, filed Sep. 30, 2002, Inventors: Partsch et al.
U.S. Appl. No. 10/144,579, filed May 13, 2002, Edmonds et al.
Pending U.S. Appl. No. 10/144,579, filed May 13, 2002, inventors Edmonds et al.*

* cited by examiner

*Primary Examiner*—Jonathan Salata
(74) *Attorney, Agent, or Firm*—Brinks Hofer Gilson & Lione

(57) ABSTRACT

A method of protecting an integrated circuit that includes sensing a temperature of an integrated circuit, comparing the sensed temperature with a threshold temperature and controlling operation of the integrated circuit based on the comparing.

22 Claims, 4 Drawing Sheets

PRIOR ART

PRIOR ART

USE OF AN ON-DIE TEMPERATURE SENSING SCHEME FOR THERMAL PROTECTION OF DRAMS

BACKGROUND OF THE INVENTION

1. Field of the Invention

The present invention relates to the field of memory chips.

2. Discussion of Related Art

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106. As shown in FIGS. 2 and 3, the memory storage cells 102 are arranged in arrays 108, wherein memory storage cells 102 in each array 108 are interconnected to one another via columns of conductors 110 and rows of conductors 112. The transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0–15 that receive and send input signals and output signals. The input signals are relayed from the pins DQ0–15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read, Write and Refresh, are well known and so there is no need to discuss them for the purpose of describing the present invention.

It is noted that new generations of SDRAM chips are being optimized for bandwidth. The most common method of accomplishing such optimization is to increase the clocking rate of SDRAM chips. By increasing the clocking rate and shortening operation cycles for normal operations, the consumption of current and power during operations increases. Since the internal temperature of the chip is proportional to the power consumption, increasing the clocking rate will result in an increase in the internal temperature of the chip.

It is known that there are circumstances where the heat generated in SDRAM chips optimized for bandwidth exceeds the maximum amount of heat that the chip package can dissipate. In most cases, the extent of time at which the generated heat exceeds the maximum amount of heat that can be dissipated is so short that the thermal constant of the chip package is sufficiently high in value so as to prevent destruction of the SDRAM chip. However, when such SDRAM chips are controlled by software, it is possible to write a command pattern, such as a thermal virus, which requests optimizing bandwidth and increasing clocking for sufficiently long periods of time that the thermal constant of the chip package is not sufficiently high to prevent the thermal destruction of the SDRAM.

SUMMARY OF THE INVENTION

One aspect of the present invention regards a thermal protection system for an integrated circuit that includes an integrated circuit and a temperature sensor that is positioned so as to sense a temperature of the integrated circuit and generates a signal representative of the sensed temperature. A comparator is connected to the temperature sensor so as to receive the signal representative of the sensed temperature, wherein the comparator compares the signal with a threshold temperature and generates a comparison signal. A control system that is connected to the integrated circuit and the comparator, wherein the control system receives the comparison signal and controls operation of the integrated circuit based on the comparison signal.

A second aspect of the present invention regards a method of protecting an integrated circuit that includes sensing a temperature of an integrated circuit, comparing the sensed temperature with a threshold temperature and controlling operation of the integrated circuit based on the comparing.

Each of the above aspects of the present invention provides the advantage of preventing the thermal destruction of a memory chip via a software command, such as a thermal virus.

The present invention, together with attendant objects and advantages, will be best understood with reference to the detailed description below in connection with the attached drawings.

DETAILED DESCRIPTION OF THE INVENTION

Figure 1:
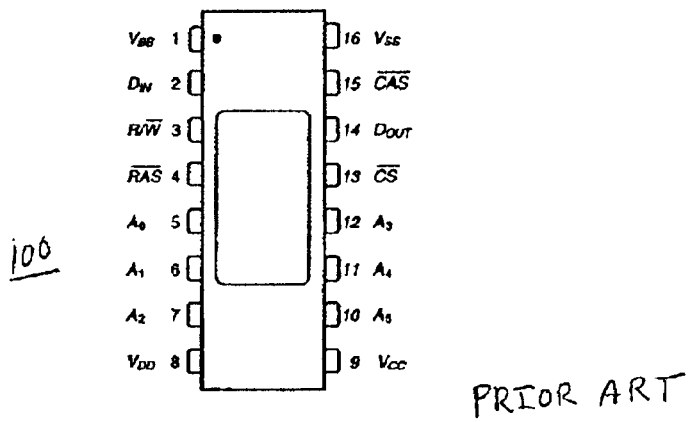
FIG. 1 schematically shows a top view of an embodiment of a known memory chip.
Figure 2:
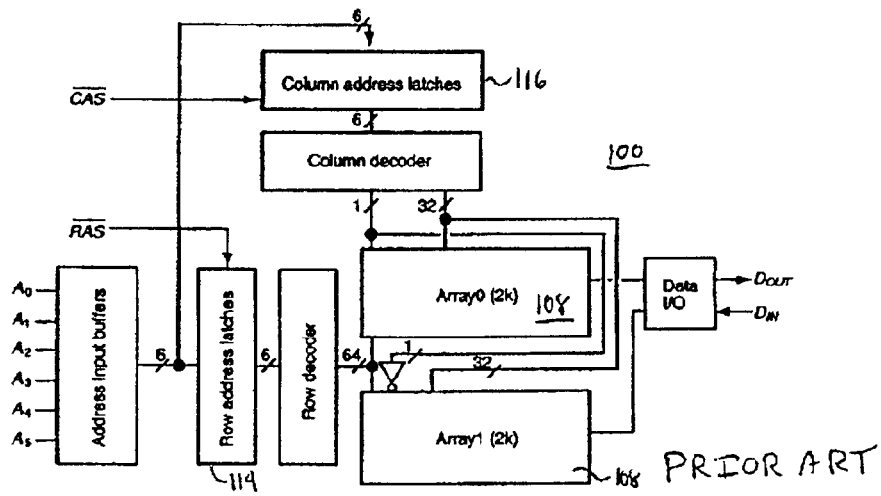
FIG. 2 shows a block diagram of the memory chip of FIG. 1.
Figure 3:
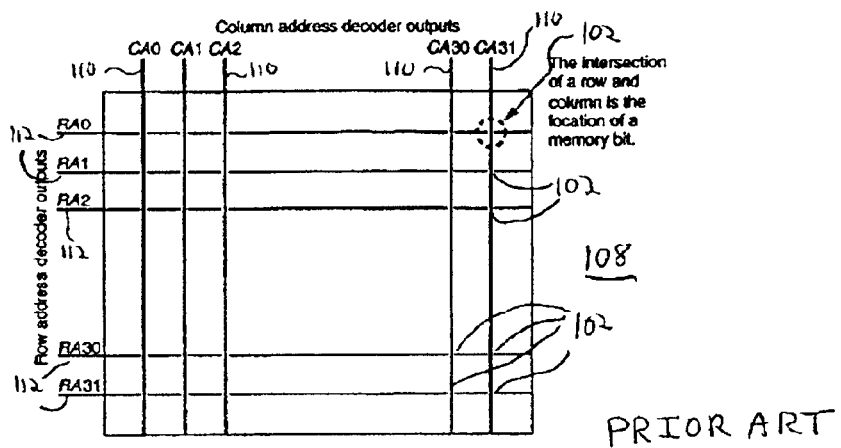
FIG. 3 schematically shows an embodiment of a memory array to be used with the memory chip of FIG. 1.
Figure 4:
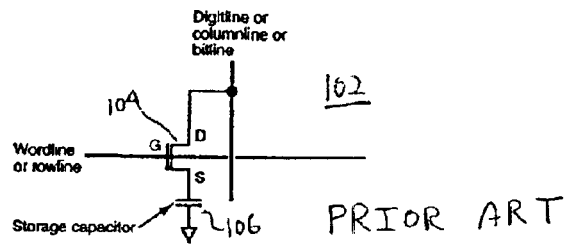
FIG. 4 schematically shows an embodiment of a memory cell to be used with the memory array of FIG. 3.
Figure 5:
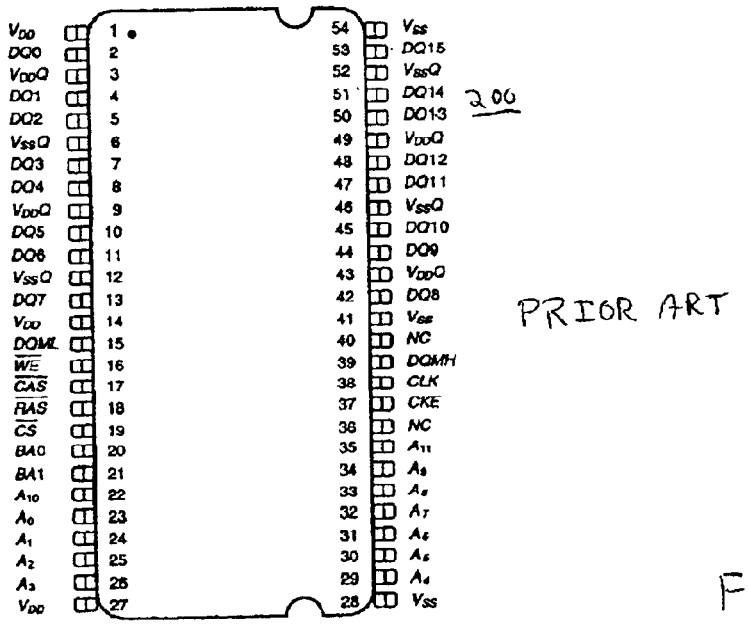
FIG. 5 schematically shows a top view of a second embodiment of a known memory chip.
Figure 6:
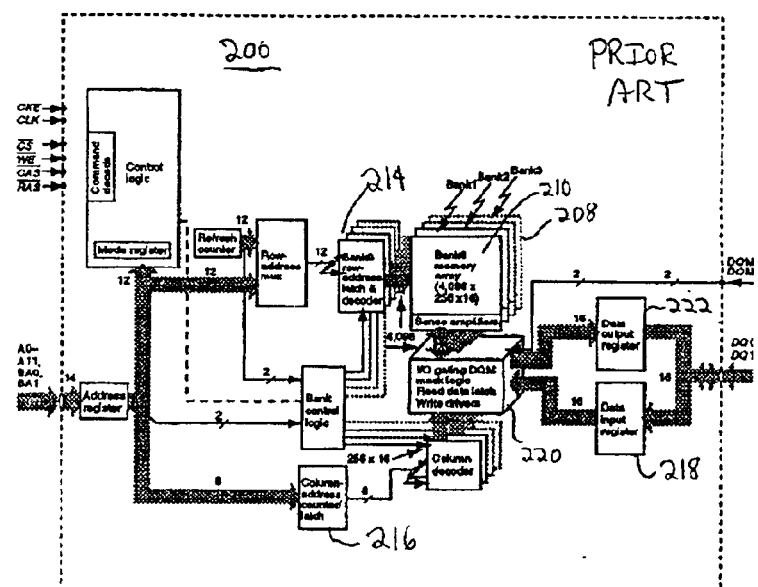
FIG. 6 shows a block diagram of the memory chip of FIG. 5.
Figure 7:
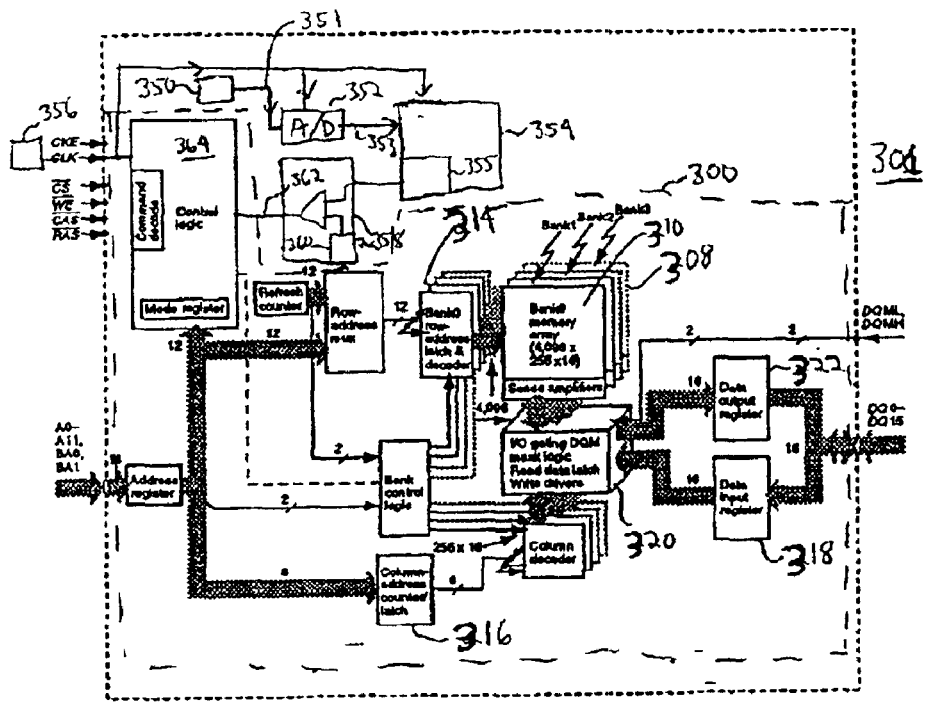
FIG. 7 shows a block diagram of an embodiment of a thermal protection system for a memory according to the present invention.

As shown in FIG. 7, a thermal protection system 301 according to the present invention includes an integrated circuit, such as a SDRAM chip 300 that has a structure similar to that of the SDRAM chip 200 described previously with respect to FIGS. 5 and 6. In particular, the SDRAM chip 300 includes a bank of memory arrays 308 that include memory storage cells 310 interconnected to one another via columns and rows of conductors in a manner similar to the memory arrays 208 and memory storage cells 210 discussed previously. The memory chip 300 includes twelve address input contact pins A0–A11, row address strobe (RAS) input pin, column address strobe (CAS) input pin and data input/output pins DQ0–15 that receive and output signals in the same manner as their counterparts in the SDRAM chip 200 discussed previously. It should be noted that the present invention can be used with other types of memory chips, such as other types of semiconductor integrated circuits and other types of memory devices, such as SDRAMs and DDR SDRAMs.

The signals associated with the input contact pins A0–A11 are fed to a bank of row address latches 314 and a bank of column address latches 316 that correspond to and operate in the same manner as the latches 214 and 216, respectively. The signals associated with the data input/output pins DQ0–15 are relayed to or from data input register 318, data output register 322 and DQM processing component 320 that correspond to and operate in the same manner as registers 218, 222 and DQM processing component 220, respectively. Note that the DQM processing component 320 includes read data latches and write data latches.

As shown in FIG. 7, the thermal protection system 301 further includes a temperature sensor 350 that is attached to the die of the SDRAM chip 300 and centrally positioned on the SDRAM chip 300 and may be connected to a power bus or a temperature sensitive net so as to sense a real time temperature of the SDRAM chip 300. Note that a variety of known sensors, such as a wheatstone bridge, would be acceptable for the temperature sensor 350. The temperature sensor 350 generates an analog signal $T_{analogreal}$ representative of the sensed real time temperature and the signal 351, $T_{analogreal}$, is sent to an analog-to-digital converter 352 where it is digitized. The digitized signal 353, $T_{digitalreal}$, is then sent to a register 354 where its value is stored in a memory 355 thereof. The analog-to-digital converter 352 and the register 354 are run by clock signals sent by a clock 356 that may be a system clock of the memory chip 300. The stored value $T_{digitalreal}$ of the sensed real time temperature is then sent to a comparator 358 that is connected to the register 354. Note that besides the register 354, the digitized signal 353 may be sent to a DQ pin pursuant to a temperature sensing protocol disclosed in a U.S. patent application to Johnathan T. Ednionds et al., filed concurrently with the present application and entitled "The Use of DQ Pins on a RAM Memory Chip for a Temperature Sensing Protocol," U.S. application Ser. No. 10/144,579, the entire contents of which is incorporated herein by reference.

The comparator 358 includes a memory 360 that stores a threshold temperature $T_{threshold}$ that corresponds to a maximum tolerable temperature, such as 55° C., for the memory chip 300. The maximum tolerable temperature has a value that ranges from 55° C. to 75° C. depending on the heat dissipation properties of the memory chip. The comparator 358 compares the value of $T_{digitalreal}$ with the value of the threshold temperature $T_{threshold}$ and generates a comparison signal 362 that indicates whether or not the value of $T_{digitalreal}$ exceeds the value of $T_{threshold}$. Note that in another embodiment, the threshold temperature $T_{threshold}$ is not stored in a memory, but instead is supplied to the SDRAM chip 300 and comparator 358 via a pin of the chip 300.

Figure 8:
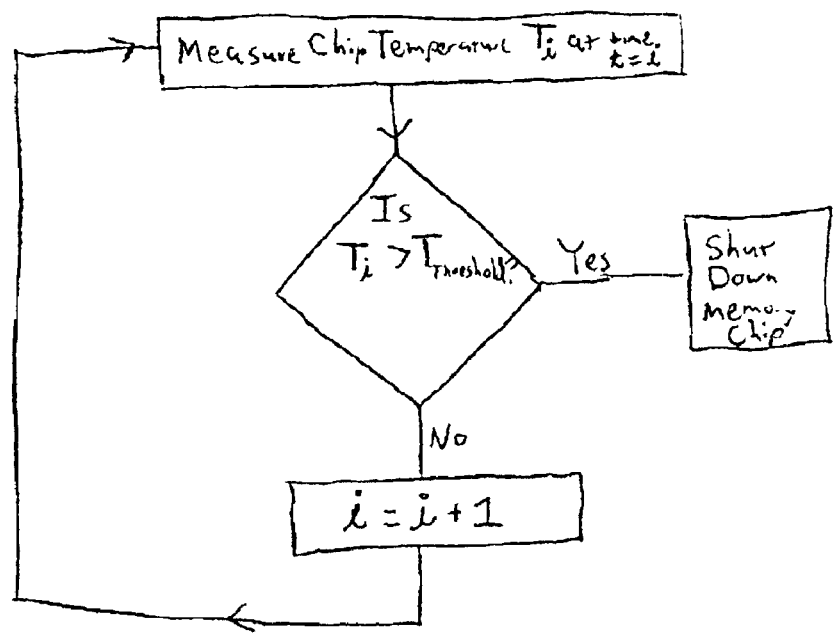
FIG. 8 shows an embodiment of a method of thermally protecting a memory according to the present invention.

As shown in FIG. 7, the comparison signal 362 is sent to a control system 364 that is connected to the memory chip 300. The control system 364 controls operation of the memory chip 300 based on the comparison signal 362. For example, if the comparison signal 362 indicates that the value of $T_{digitalreal}$ exceeds the value of $T_{threshold}$, then the control system 364 shuts down the memory chip 300 by sending a signal SHUTDOWN to control circuitry 364, which results in the disablement of the internal clock signals of the memory chip 300. If the comparison signal indicates that the value of $T_{digitalreal}$ does not exceed the value of $T_{threshold}$, then the control system 364 will allow the memory chip 300 to continue operating at its present state. As shown in FIG. 8, if the memory chip 300 is not shut down, then the above process is repeated at the next clock pulse. Note that after the memory chip 300 is shut down, the memory chip 300 must be rebooted in order to operate again.

Figure 9:
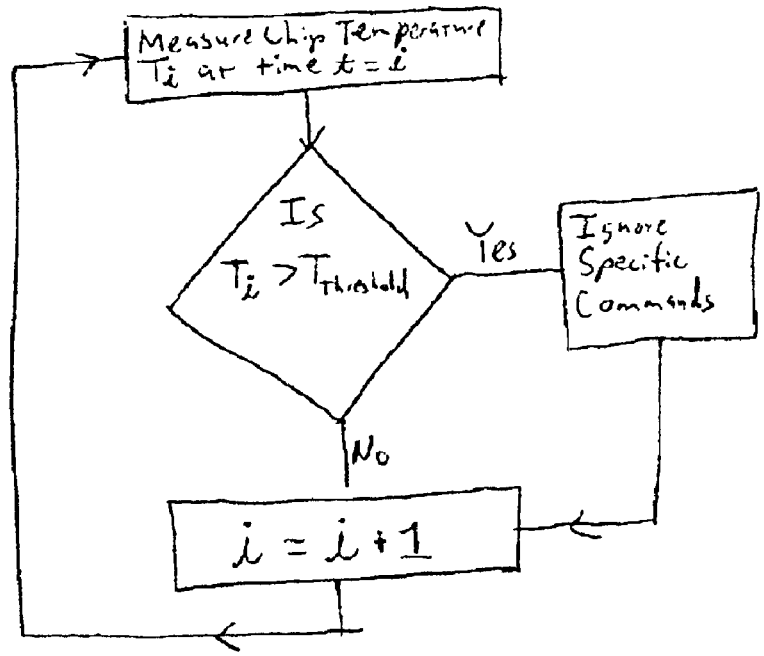
FIG. 9 shows a second embodiment of a method of thermally protecting a memory according to the present invention.

Another mode of operation is shown in FIG. 9. In this mode of operation, the comparison signal 362 is sent to the control system 364. If the comparison signal 362 indicates that the value of $T_{digitalreal}$ exceeds the value of $T_{threshold}$, then the control system 364 generates the SHUTDOWN signal as before. However, the SHUTDOWN signal does not shut down the memory chip 300 in the manner discussed previously. Instead, the SHUTDOWN signal reduces power consumption by the memory chip 300 by having specific commands, except POWER DOWN and EXIT, in the central controlling unit 364 be ignored so that the maximum performance of the memory chip is reduced. If the comparison signal indicates that the value of $T_{digitalreal}$ does not exceed the value of $T_{threshold}$, then the control system 364 will allow the memory chip 300 to continue operating at its present state. As shown in FIG. 9, if the memory chip 300 is not shut down, then the above process is repeated at the next clock pulse irrespective of whether or not the value of $T_{digitalreal}$ does not exceed the value of $T_{threshold}$.

Figure 10:
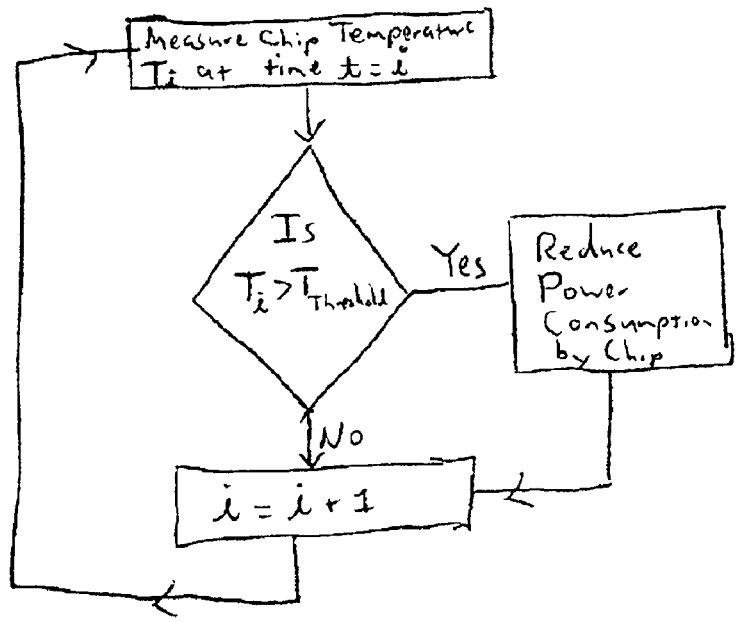
FIG. 10 shows a third embodiment of a method of thermally protecting a memory according to the present invention.

It is noted that the mode of operation shown in FIG. 9 can result in the memory chip 300 being shut down in the event that the memory chip 300 does not comes out of POWER DOWN or the data may become corrupt. A mode of operation that avoids such shut down is shown in FIG. 10. In this mode of operation, the comparison signal 362 is sent to the control system 364. If the comparison signal 362 indicates that the value of $T_{digitalreal}$ exceeds the value of $T_{threshold}$, then the control system 364 generates the SHUTDOWN signal as before. However, the SHUTDOWN signal does not shut down the memory chip 300. Instead, the SHUTDOWN signal is sent to the controlling unit 364 of the memory chip 300 where the SHUTDOWN signal causes a reduction in power consumption by the memory chip 300 by either 1) reducing the frequency of internal clock signals of the memory chip 300 so as to take advantage of the low thermal reaction time of the memory chip 300, 2) selecting a particular memory of the memory chip 300, such as leaving one bank permanently on versus continuously switching between banks, or 3) changing the workload of a memory of the memory chip 300. Of course, a combination of the above-mentioned three power reduction processes can also be employed. By using the SHUTDOWN signal as a control signal for the controlling unit 364, the memory chip 300 can regain full performance again if the signal SHUTDOWN is deactivated again after the memory chip 300 has cooled below the threshold temperature.

The foregoing description is provided to illustrate the invention, and is not to be construed as a limitation. Numerous additions, substitutions and other changes can be made to the invention without departing from its scope as set forth in the appended claims.

We claim:

1. A thermal protection system for a memory chip, comprising:
   a memory chip;
   a temperature sensor that is positioned so as to sense a temperature of said memory chip and generates a signal representative of said sensed temperature;
   a comparator connected to said temperature sensor so as to receive said signal representative of said sensed temperature, wherein said comparator compares said signal with a threshold temperature and generates a comparison signal; and
   a control system that is connected to said memory chip and said comparator, wherein said control system receives said comparison signal and controls operation of said memory chip based on said comparison signal;
   wherein said control system reduces power consumption by said memory chip if said sensed temperature is above said threshold temperature, by having specific commands in the control system be ignored.

2. The thermal protection system of claim 1, further comprising a memory to store said threshold temperature.

3. The thermal protection system of claim 1, wherein said threshold temperature corresponds to a maximum tolerable temperature for said memory chip.

4. The thermal protection system of claim 1, wherein said temperature sensor is attached to said memory chip.

5. The thermal protection system of claim 1, wherein said temperature sensor is attached to a die of said memory chip.

6. The thermal protection system of claim 1, further comprising a register into which a value corresponding to said sensed temperature is stored.

7. The thermal protection system of claim 6, further comprising a clock that is connected to said register.

8. The thermal protection system of claim 7, wherein said clock is a system clock of said memory chip.

9. The thermal protection system of claim 1, wherein said memory chip comprises a DRAM memory.

10. A method of protecting a memory chip, comprising:
    sensing a temperature of said memory chip;
    comparing said sensed temperature with a threshold temperature; and
    controlling operation of said memory chip based on said comparing comprising reducing power consumption by said memory chip based on said comparing by having specific commands in the control system be ignored.

11. The method of claim 10, further comprising storing said threshold temperature.

12. The method of claim 10, wherein said threshold temperature corresponds to a maximum tolerable temperature for said memory chip.

13. The method of claim 10, wherein said reducing power consumption by said memory chip is performed if said sensed temperature is above said threshold temperature.

14. A thermal protection system for a memory chip, comprising:
    a memory chip;
    a temperature sensor that is positioned so as to sense a temperature of said memory chip and generates a signal representative of said sensed temperature;
    a comparator connected to said temperature sensor so as to receive said signal representative of said sensed temperature, wherein said comparator compares said signal with a threshold temperature and generates a comparison signal; and
    a control system that is connected to said memory chip and said comparator, wherein said control system receives said comparison signal and controls operation of said memory chip based on said comparison signal,
    wherein said control system reduces power consumption by said memory chip if said sensed temperature is above said threshold temperature by selecting a particular memory of the memory chip.

15. The thermal protection system of claim 14, further comprising a memory to store said threshold temperature.

16. The thermal protection system of claim 14, wherein said threshold temperature corresponds to a maximum tolerable temperature for said memory chip.

17. The thermal protection system of claim 14, wherein said temperature sensor is attached to said memory chip.

18. The thermal protection system of claim 14, wherein said temperature sensor is attached to a die of said memory chip.

19. The thermal protection system of claim 14, further comprising a register into while a value corresponding to said sensed temperature is stored.

20. The thermal protection system of claim 19, comprising a clock that is connected to said register.

21. The thermal protection system of claim 20, wherein said clock is a system clock of said memory chip.

22. The thermal protection system of claim 14, wherein said memory chip comprises a DRAM memory.

* * * * *